United States Patent [19]

Stutz

[11] 3,982,106
[45] Sept. 21, 1976

[54] SYSTEM FOR MEASURING THE LONGITUDINAL OR ANGULAR DISPLACEMENT OF A MOVABLE COMPONENT

[75] Inventor: Theo Stutz, Basserdorf, Switzerland
[73] Assignee: Contraves AG, Zurich, Switzerland
[22] Filed: Nov. 10, 1975
[21] Appl. No.: 630,723

Related U.S. Application Data

[63] Continuation of Ser. No. 467,289, May 6, 1974, abandoned.

[30] Foreign Application Priority Data

May 14, 1973 Switzerland.......................... 6792/73

[52] U.S. Cl. .......................... 235/92 GC; 235/92 V; 235/92 CC; 235/92 PL; 235/92 R; 250/237 G
[51] Int. Cl.² .......................... G06M 3/14; H01J 5/16
[58] Field of Search ........ 235/92 GC, 92 V, 92 MP, 235/92 PL, 92 DN, 92 CC; 250/237 G; 340/347 P

[56] References Cited
UNITED STATES PATENTS

| | | | |
|---|---|---|---|
| 3,024,986 | 3/1962 | Strianese et al................ | 235/92 GC |
| 3,122,735 | 2/1964 | Townsend........................ | 235/92 V |
| 3,544,800 | 12/1970 | Elliott.............................. | 250/237 G |
| 3,591,841 | 7/1971 | Heitmann et al. .............. | 250/237 G |
| 3,663,803 | 5/1972 | Mohan et al..................... | 235/92 V |
| 3,749,925 | 7/1973 | Hertrich........................... | 250/237 G |
| 3,886,542 | 5/1975 | Minoru Ohtsuka ............ | 235/92 GC |

*Primary Examiner*—Joseph M. Thesz
*Attorney, Agent, or Firm*—Werner W. Kleeman

[57] ABSTRACT

A system for measuring the longitudinal or angular displacement of a movable component with respect to a reference position, wherein an increment scale track is supported at a scale carrier affixed to the component, and associated therewith are stationary increment-reading means, an increment counter and electrical circuits for counting properly with respect to the direction of motion of the component the algebraic sum of the increment units traversing in front of the increment-reading means. The scale carrier supports at a second scale track parallel to the increment scale track a multiplicity of absolute-value marks, each of which is spaced from the next following mark by a particular spacing characterizing the absolute value of its distance to the reference position, and which spacing is counted in increment units. The measuring system is constructed to determine the characteristic number of increments which have been algebraically counted at the increment counter from the traversing of any absolute-value mark to the traversing of the next following absolute-value mark in front of a mark-reading means, and to derive from such characteristic number the corresponding absolute value of the displacement of the movable component with respect to the reference position. The absolute value associated with a given characteristic number is fixed in an appropriately programmed read-only storage means. The counter state of the increment counter is then set to the correct absolute value as delivered by the read-only storage means.

7 Claims, 3 Drawing Figures

SYSTEM FOR MEASURING THE LONGITUDINAL OR ANGULAR DISPLACEMENT OF A MOVABLE COMPONENT

CROSS REFERENCE TO RELATED CASE

This application is a continuation of my commonly assigned copending United States application, Ser. No. 467,289, filed May 6, 1974, and entitled "Length and/or Angle Measuring Apparatus", now abandoned.

BACKGROUND OF THE INVENTION

The present invention relates to a new and improved construction of automatic displacement or movement measuring system such as employed, by way of example, at machine tools or theodolite devices for the continuous digital display of the position or setting of a component of such machine or device, which component can be forwardly and rearwardly displaced in linear motion or in rotation about an axis relative to an actual or virtual reference position to which there is assigned a zero display. Another possible field of application of such type measuring system is as an actual value transmitter in automatic control devices for positioning movable components, especially in devices of the type wherein signals are processed and displayed digitally.

Basically two types of automatic displacement or movement measuring devices are known to the art. In the first type, the position of the component is measured and eventually indicated in the form of a so-called absolute value which is independent of what has previously occured and is deduced according to a code from readings taken at a multiplicity of binary coded tracks of a scale carrier, for instance with photoelectric reading means. This absolute value of the position is in fact equivalent to the displacement of the component from a reference position. Examples of such type position-measuring devices have been disclosed in Swiss patent 374,207 and U.S. Pat. No. 2,979,710 (Toth). For measuring the position of a component carrying out a linear motion over a total length of 500 millimeters with a desired accuracy of 1:50000 it is necessary to accurately measure the absolute values of position in units of 0.01 millimeter, for which purpose there is required a 16-track scale. Similarly, for an angle-measuring device possessing approximately the same accuracy of 1:50000 at the most finely graduated code track supported at a rotatable disk of about 20 centimeters diameter, there is also required a 16-track scale for the resolution of the absolute angular values to be obtained, the most finely graduated code track then having graduation units of about 0.008 centesimal grade (periphery = 400 centesimal graduations). It should be readily apparent that such type absolute-value measuring devices are complicated to manufacture and are subject to functional disturbances because each local contamination of a graduation track can trigger an erroneous display and also because the most finely graduated code track cannot be read with certainty.

A second class or type of automatic displacement measuring devices have become known to the art under the general designation of "increment-counter systems". In such systems a stationary reading means cooperates with a single increment-bearing track, i.e. a single scale track uniformly divided with the desired fineness into graduation units of equal magnitude, the scale track being located at a scale carrier affixed to the component displaceable in linear or angular motion. The reading means is operatively associated with electrical circuits in order to properly count, with regard to the direction of motion, each traversing of a graduation unit of the increment scale in front of the reading means and at any instance in time to deliver as a measurement value the algebraic sum of the counted graduation units (plus and minus signs being assigned to each direction of motion, respectively). Under the precondition that counting occurs free of error, the algebraic sum of the counted graduation units then corresponds to the desired absolute value of position, assuming a starting position of the scale carrier has been defined and associated with a predetermined absolute value, preferably zero.

An exemplary embodiment of such type incremental measurement system has been disclosed in Swiss patent 499,091. There are provided scale-carrier disks each having a circular-shaped graduation track of 50,000 periods of graduation units, each of which consist of a pair of strips which are respectively opaque and transparent. Each strip possesses the width of one-half of a graduation unit. The graduation tracks are displaced relative to one another in order to possess a certain mutual eccentricity. This prior art increment-measuring device or system also comprises stationary photoelectric reading means, each embodying a respective illumination mechanism and, for instance, three photocells as well as electrical circuits for processing the photocell currents. The reading means are associated with further electrical circuits in order to properly count, with respect to the direction of motion, the moire fringes resulting from the common illumination and the cooperation of both graduation tracks. It is a property of such moire fringes that they form a pattern of light and dark fringes having a period much larger than the period of the pattern-generating graduation tracks, thus allowing the reading means to be of larger dimension. The three photocell currents of each reading means are combined into a three-phase current system from which there can be derived a multi-phase (for instance a two-phase) binary signal system which is periodic in graduation units of the graduation tracks, and the periods of which can be counted rapidly, sign-correct, and free of any disturbance in a counter.

Another embodiment of such type incremental measuring system has been disclosed in U.S. Pat. No. 3,591,841 (Heitmann et al.), wherein at least one increment-scale track supported at a movable scale carrier is associated firstly with a photoelectric reading means comprising a plurality of sensing fields and secondly with a stationary graduation carrier having unequally spaced respective opaque and transparent portions. The cooperation of the stationary graduation carrier with the plurality of sensing fields and the increment-scale track results in a coded output of the reading means delivering the displacement magnitude as well as the displacement direction of the increment scale. In this state-of-the-art system the absolute value of the scale-carrier position is evaluated by means of a plurality of additional binary code tracks delivering a coarse digital indication implementing the increment-scale reading. Such an arrangement requires a plurality of binary code-reading means in addition to at least one increment-reading means. Furthermore, the overall precision of the increment-reading cannot be enhanced by use of the moire technique, the latter being incompatible with the increment-scale reading system as disclosed; accordingly, the reading accuracy is limited to the order of magnitude of the grating accuracy of the finest increment-scale track.

According to other prior art incremental measuring system there is arranged at a movable scale carrier at least one increment-scale track and at least one auxiliary track having auxiliary marks, both tracks being disposed parallel or concentric, as the case may be. The counter state of an increment counter associated with the increment-scale track and its respective reading means is synchronized by the pulses generated by auxiliary reading means scanning the auxiliary marks, i.e. there is insured that after a displacement of the scale carrier through a path corresponding to a period interval of auxiliary marks the counter state of the increment counter, if necessary, is either forwardly or rearwardly stepped or reset to the correct counter state. Such prior art incremental measuring systems are disclosed in several publications.

For instance, in U.S. Pat. No. 3,122,735 (Townsend) there are disclosed several circular increment-scale tracks of which the one with the largest period interval bears a single auxiliary mark, the period interval of the latter track thus constituting one complete revolution of the scale carrier. This single auxiliary mark defines a reference position of the scale carrier which is associated with the value zero displayed at the counter.

In U.S. Pat. No. 3,544,800 (Elliott) there are taught two circular tracks, one constituting an increment-scale track associated with respective reading means comprising means for generating and reading a moire pattern, the other constituting an auxiliary scale track bearing a random arrangement of marks cooperating with respective auxiliary reading means comprising a mask, the latter bearing an arrangement of masking marks correlated to the random arrangement of marks on the auxiliary-scale track: thus there is a single reference position of the scale carrier in which a signal is generated at the auxiliary reading means to reset the counter to the value zero associated with this single reference position.

In U.S. Pat. No. 3,024,986 (Strianese et al.) there are taught three circular tracks, each associated with respective reading means, one track defining a first increment-scale track, another track defining an auxiliary scale track having a single auxiliary mark defining a single reference position of the scale carrier, and still another track defining a second increment-scale track, pitch of which is slightly different from the pitch of the first increment-scale track. Both increment-scale tracks cooperate with each other and with their respective reading means and the associated electrical circuits to generate a vernier effect (which can be considered equivalent to a moire effect), the resulting measurement thus being more accurate than a direct reading of a single increment-scale track.

In a particular system as disclosed in German patent publication 1,214,892 the starting point of the auxiliary track is correlated to the position of the scale carrier at the start of the measurement operation, so that such start position is taken as a reference position associated with the value zero at the increment counter.

The previously discussed type systems have been found to be particularly satisfactory in the case of highly accurate angle and length measurements. Yet, these systems are all associated with the drawback that in the event of a breakdown during operation there is lost the correct counter state and thus the absolute value of the magnitude to be measured. Accordingly, when the system is again placed into operation the movable component must be first brought to the reference position in order to permit the increment counter to be readjusted to the correct value, preferably zero. This is oftentimes not possible at all, for instance, in the manufacture of parts wherein the reference point or surface thereof gets lost as their manufacture proceeds or, for instance, in the case of weapons and other devices which only can be adjusted over a limited range of movement.

There have been proposed several solutions to eliminate this drawback by providing more than one reference position of the movable component, the counter state being set to the appropriate value at either reference position which may be used. According to an incremental measuring system as disclosed in Swiss patent 472,021 there is arranged at a movable scale carrier, parallel to the increment-scale track, a second track having equally spaced auxiliary marks whose intervals can be identified, i.e. these intervals can be objectively differentiated. For this purpose the second track comprises, on the one hand, wide graduations, the one edge of which serve as auxiliary marks, and, on the other hand, increment graduations, the number of which serves as an absolute-value indication of the associated auxiliary mark. The reading means associated with the second track is thus necessarily constructed such that individual increments can be read-out. With this system there is present the drawback that when a very high degree of fineness of the increment graduations is required on each track in order to attain a very high overall accuracy of the system, there is simultaneously required a very high resolution capability and a very high sensitivity of the reading means for the second track, since it is not possible to use a moire technique for counting the increment graduations between the wide marks of such second track. Such solution is therefore extremely sophisticated, and the limits which can be technologically attained remain considerably below the resolution capacity and sensitivity of a moire technique. The accuracy of the absolute-value indication is at most equal to the accuracy of the reading-out operation at the auxiliary mark track. With the aforementioned incremental measuring system there is indeed provided at the increment-scale track a means for generating and reading moire fringes, whereby it is possible to determine differential values with the high accuracy of the moire technique. Yet, the absolute-value indication is limited to the accuracy of the reading of the increment graduations on the second track, so that there is destroyed the usefulness of the entire means for generating and reading moire fringes and the overall accuracy of the system is restricted to the accuracy of the absolute-value determination.

U.S. Pat. No. 3,663,803 (Mohan et al.) teaches a system for unambiguously reading a plurality of marks located on a scale track of a movable scale carrier. The resulting mark signal is enhanced by matching opaque and transmitting (or light and dark) portions of the marks with respective portions of photoelectric reading means. The system is devised to read the marks while the scale carrier is moving, i.e. the waveform and frequency of the mark signal is analyzed to identify the mark. It is not possible to sharply define the position of any mark on the scale track, because the reading of the mark necessitates the displacement of the scale carrier to a certain extent, a given mark being identified only after it has wholly traversed in front of the reading means.

In order to solve the problem of enhancing the accuracy when reading the position of absolute-value marks, U.S. Pat. No. 3,749,926 (Hertrich) teaches a movable scale carrier having a scale track with a scale combining absolute-value and increment marks. The scale track comprises two sub-tracks associated with respective photoelectric reading means each generating a sub-signal, with masks and with electrical circuits for combining the two resulting sub-signals into a single mark signal. In each sub-track there are provided opaque and transparent portions in an arrangement such that the sub-signals have a predetermined phase-relationship with respect to the motion of the scale carrier. The combination of the two sub-signals results in a non-zero mark signal on the one side of the mark, whereas on the other side of the mark there are zeroes of the mark signal which appear with the periodicity of the increment scale. In the vicinity of the absolute-value mark location there is provided a large change in phase of the sub-signals with respect to each other, in order to obtain a mark signal having zeroes at scale carrier locations as sharply defined as possible. In this system, however, there is not possible any identification of one selected absolute-value mark among several such marks, so that only a single mark may be used, for instance to identify a single reference or starting position of the scale carrier, i.e. of the movable component. Furthermore, the starting position is defined as the location where there is obtained one selected zero of the mark signal, preferably, but non necessarily, the first such location. Such system thus may be used only for one predetermined direction of movement of the scale carrier, which is the one direction for which no zero of the mark signal does occur before the absolute-value mark has traversed in front of the reading means and for which the mark signal is periodically zero after the absolute-value mark has traversed. Such a system is therefore neither usuable in connection with a plurality of absolute marks, nor for measurements at components movable in either possible direction of movement.

SUMMARY OF THE INVENTION

Hence, it is a primary object of the present invention to provide an improved construction of system for measuring the longitudinal (linear) or angular displacement or movement of a component movable with respect to a reference position thereof, which system is not associated with the aforementioned drawbacks and limitations of the prior art proposals.

Another and more specific object of the present invention aims at the provision of a new and improved construction of a system for measuring the longitudinal or angular displacement of a component movable with respect to a reference position thereof, wherein an increment scale track is supported at a scale carrier affixed to the component, the increment scale is subdivided into graduation units of equal magnitude, associated therewith are a stationary increment-reading means, an increment-counting means and electrical circuit means for property counting with respect to the direction of displacement of the component the algebraic sum of the graduation units of the increment scale traversing in front of the increment-reading means, plus and minus signs being respectively assigned to each direction of displacement, and which arrangement is complemented by a transmitter of relatively uncomplicated construction for sensing the absolute value of the position of the component with respect to the reference position thereof, and wherein the improved system renders possible, after placing into operation the measuring system at any selected one of a multiplicity of settings, to exactly set the increment-counting means at the counting state which corresponds to the absolute value of the position associated with the selected setting, thereby insuring that at such increment-counting means there is stored the correct absolute value of the position of the movable component with respect to the reference position thereof.

Now in order to implement the above objects, and others which will become more readily apparent as the description proceeds, the scale carrier supports in conventional manner at a second track parallel to the increment scale track a multiplicity of absolute-value marks, each of which is spaced from the next-neighboring mark by a particular spacing characteristic of the value of its distance to the reference position, and which spacing is counted in graduation units of the increment scale. The measuring system is constructed to: (1) determine the characteristic number of graduation units of the increment scale which have been algebraically counted at the increment-counting means with respect to the direction of displacement of the component from the traversing of any absolute-value mark to the traversing of the next-following absolute-value mark in front of a mark-reading means; (2) to derive from such characteristic number the corresponding absolute value of the displacement of the movable component with respect to the reference position thereof, the absolute value associated with a given characteristic number being fixed in an appropriately programmed allocation means; and (3) to set the counter state of the increment-counting means to the correct absolute value as delivered by the allocation means.

Basically it would be possible for the aforementioned absolute-value marks at the second scale track of the scale carrier to be simple lines, the maximum width of which cannot be greater than one-half of a graduation unit of the increment scale, provided that they trigger in the respective mark-reading means a clear and defined mark-signal which allows a faultless and unambiguous determination of the traversing of the corresponding mark in front of the mark-reading means. If, however, the increment scale is divided into graduation units of extremely small magnitude, then an absolute-value mark composed of a single fine line is subject to contamination and is not adequate for the unambiguous triggering of a traversing-signal in the respective mark-reading means.

However, such difficulty can be overcome in that the absolute-value marks are constructed as a code combination of transparent and opaque or light and dark strips which extend in the direction of displacement over a length comprising a multiplicity of graduation units of the increment scale. Further, such marks cooperate with a mark-reading means having a multiplicity of light-sensitive strips electrically connected in such a combination that correlation, i.e. matching occurs, and a mark-signal is generated in the mark-reading means only at one sharply defined position of an absolute-value mark in front of the mark-reading means.

Advantageously there is contemplated that a counter-state comparator is arranged between the increment-counting means and a counter-state storage means set to store the state of the increment-counting means at each moment of time defined by a mark-signal. Such counter-state comparator is known in the art and delivers at its output a sign-correct difference of two counter-states each of which have been delivered to a respective input of the comparator. During a first cycle phase, immediately after the generation of a mark-signal and prior to the counting of a further graduation unit of the increment scale, the counter-state comparator transmits the sign-correct difference between the earlier state of the increment-counting means as stored in the counter-state storage means and the actual state of the increment-counting means as an input to the allocation means, such input being accepted by the allocation means as a characteristic number of graduation units addressing an associated absolute value. During a second cycle phase, still prior to the counting of a further graduation unit of the increment scale, the absolute value associated with the characteristic number of graduation units is transmitted from the allocation means in order to simultaneously set the increment-counting means and the counter-state storage means to this value as a new counter state and storage state, respectively (it is known in the art to use a counting means settable at a desired counting state stored in and delivered by an appropriate setting means).

A simplified embodiment of the invention can be constructed such that the effect of the first traversing of an absolute-value mark in front of the mark-reading means after placing the equipment into operation, i.e. the first-generated mark-signal sets the increment-counting means to the zero counter state, whereafter during a first cycle phase the counter state reached at the moment of time defined by the next-following mark-signal is transmitted as a characteristic number of increment units to address an associated absolute value in the allocation means, and during a second cycle phase the thus resulting absolute value is transmitted back from the allocation means to the increment-counting means to set the counter state of the latter to a corrected value.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
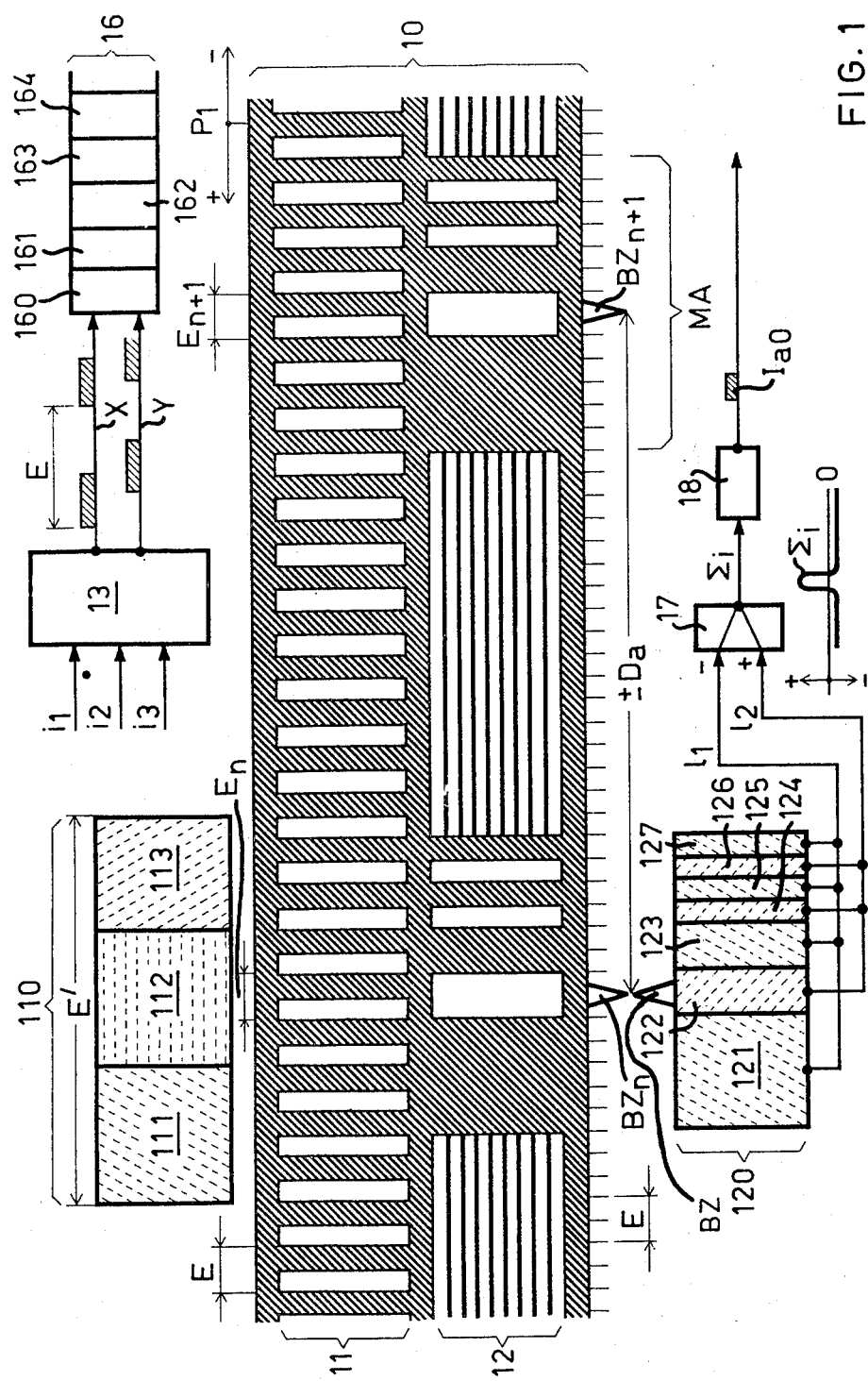
FIG. 1 is a schematic illustration showing apparatus for generating measuring signals.

Describing now the drawings, in FIG. 1 reference numeral 10 designates a scale carrier which is lengthwise movable to-and-fro in the direction of the arrow $P_1$. The scale carrier 10 supports a first scale track with a conventional increment scale 11 having equal graduation units E each consisting of a pair of respectively opaque and transparent strips of equal width. For practical applications such photoelectrically readable increment scale 11 can be subdivided into graduation units E of about 0.01 millimeter and can possess a total length of, by way of example, 1000 millimeters or more, or, for instance, it can be constructed as a circular ring having a mean diameter of 200 millimeters supported at a rotatable disk and containing over its entire periphery 50,000 graduation units E each corresponding to an angle increment of 0.008 centesimal grade (400 centesimal grade = 2 $\pi$ radians).

As concerns a stationary photoelectric reading means operatively associated with the scale track 11, such reading means may be similar to the means disclosed in my Swiss Patent No. 499,091, the disclosure of which is incorporated herein by reference. Disclosed and illustrated in the aforesaid Swiss patent is a stationary scale carrier supporting a stationary scale track with an increment scale having approximately the same subdivisions as the increment scale 11, a slight difference of orientation or pitch existing between the stationary increment scale and the increment scale 11 in order to generate moire fringes. There is also disclosed therein the illumination means required for the common illumination of the increment graduations which overlap one another at the reading location. The aforementioned features have not been illustrated in FIG. 1 since such type electro-optical increment measuring systems are quite well known in this particular art in many different constructional manifestations. As a matter of convenience in illustration, there is only shown in FIG. 1 a photoelectric cell arrangement 110 consisting of three photoelectric cells 111, 112 and 113. The total width of the photoelectric cell arrangement 110 corresponds to the period distance E' of two neighboring moire fringes appearing at the reading location due to the common illumination and cooperation of the movable and the stationary increment scales. During each displacement of the movable scale carrier 10 through a graduation unit E the moire fringes migrate in the same displacement direction but through the much greater period length E' of the moire fringes.

As disclosed in the aforesaid Swiss patent 499,091 the three photoelectric cells 111, 112 and 113 produce three photoelectric cell currents $i_1$, $i_2$ and $i_3$, also indicated in FIG. 1, which can be represented by the equations $I_o + i \cdot \sin(\omega t - 120°)$ and $I_o + i \cdot \sin(\omega t)$ and $I_o + i \cdot \sin(\omega t + 120°)$ respectively. There can be derived from these three currents at a transformation circuit 13, in a manner also disclosed in the aforesaid Swiss patent, a two-phase binary signal system X, Y which is periodic with respect to the motion of the scale carrier 10, the period being equal to the graduation units E of the increment scale 11. The algebraic sum of the periods E of the two phase binary signal system X, Y can be properly counted with respect to the direction of displacement (plus and minus sign being respectively assigned to each direction of displacement) in a forwards-backwards counter 16 equipped with the binary counting stages 160, 161, 162, 163, 164 and so forth. In a manner likewise taught in such Swiss patent 499,091 provision could be additionally made to also quantitatively determine fractions of each graduation unit E.

Further illustrated in FIG. 1 is a second scale track 12 supported at the scale carrier 10. Scale track 12 has absolute-value marks identical to each other, such as MA, each mark consisting of a code combination of alternately opaque and transparent strips and having a total width which is an integer multiple of E/2 or half the graduation unit E of the increment scale 11. According to the illustrated exemplary embodiment and looking from the left towards the right of FIG. 1, the mark MA contains four opaque strips of the respective width 5E/2, 2E/2, E/2 and E/2 spaced by three intermediately situated transparent strips of the respective width 2E/2, E/2 and E/2, the total width of the mark MA amounting to 13E/2. Of course it is to be appreciated that this arrangement is not absolutely mandatory in that the mark MA also can be differently coded in other units. What is of importance is only that each mark, such as mark MA, possesses a reading location which is defined with respect to the lengthwise direction of the scale tracks 11 and 12, and that such reading location coincides with a reading location of a predetermined graduation unit of the increment scale 11. By way of example, the middle of the marks illustrated in FIG. 1 and designated by $BZ_n$ and $BZ_{n+1}$ coincides with the middle of the respective graduation units designated by $E_n$ and $E_{n+1}$, as shown, such middle or central locations constituting respective reading locations. Between neighboring absolute-value marks, such as the marks MA, the scale track 12 is 50% light-permeable, for instance by means of alternately opaque and transparent stripes extending parallel to the lengthwise direction of scale track 12, as shown. The total width of the transparent stripes is in such a relationship to the total width of the opaque stripes that a 50% transparency will be realized.

Operatively associated with the scale track 12 is a stationary mark-reading means comprising a photoelectric cell arrangement 120 and conventional illumination means (not shown), the scale track 12 interposed therebetween thus acting as a mask. The photoelectric cell arrangement 120 consists of strips 121, 122, 123, 124, 125, 126 and 127 in similar arrangement to the strips of the mark MA. The totality of all photoelectric strips 121 to 127 forms a rectangle which is exactly divided in the manner of the mark MA and is congruent thereto. A reading location BZ of the photoelectric cell arrangement 120 is defined in the same manner as for the mark MA and congruent thereto. The photoelectric cell strips 121 of width 5E/2, 123 of width 2E/2, and 125 and 127 each of width E/2 are connected via a common conductor $l_1$ with the negative input of a differential amplifier 17. The photoelectric cell strips 122 of width 2E/2 and 124 and 126 each of width E/2 are connected via a common conductor $l_2$ with the positive input of such differential amplifier 17.

At the output of the differential amplifier 17 there appears a current labeled $\Sigma i$ which corresponds to the algebraic sum of all the photoelectric cell currents each taken with its respective sign. In the relative position of the photoelectric cell arrangement 120 and the absolute-value mark shown in FIG. 1, the reading locations BZ of the cell arrangement and $BZ_n$ of the mark conincide with one another. In such coincidence position the current $\Sigma i$ has a positive value. During any mutual displacement of the reading locations BZ and $BZ_n$ out of the depicted overlapping or coincidence position, the current $\Sigma i$ quickly drops to a negative value, as will be evident to those skilled in the art. A pulse generator 18 generates a mark-signal $I_{ao}$ of appropriate duration each time and only then when the value of the current $\Sigma i$ delivered to its input becomes positive. According to the showing of FIG. 1, the reading location $BZ_n$ at the scale track 12 of one given absolute-value mark MA is spaced from the reading location $BZ_{n\pm1}$ of any of the next-neighboring or successive absolute-value marks MA by an integer number of graduation units E as defined on the increment scale 11. The distances $D_a$ of neighboring absolute-value marks MA are, according to the invention, characteristic for the absolute value of the longitudinal or angular displacement asociated with a respective absolute-value mark, which displacement is to be measured by means of the measuring system. In the embodiment shown in FIG. 1 the distance $D_a$ between the reading locations $BZ_n$ and $BZ_{n+1}$ of two absolute-value marks, such as the marks MA, is equal to 15 graduation units E; according to the invention there are no other marks on the scale track 12, the distance $D_a$ between which would have the same value of 15 graduation units E.

The following Table illustrates, as a possible example for an increment scale 11 having 500 graduation units E and for a second scale 12 having 15 absolute-value marks, the correspondence or allocation of the absolute values $N_a$ to the mark-numbering numbers $n$ and to the distances $D_a$ of neighboring marks. In this regard it is to be observed that characteristic distances for rearward displacements are measured with a negative sign and for instance determined as the complementary values $500 - D_a$, for reasons which will become apparent while the description proceeds.

Table for the exemplary distribution of 15 absolute-value marks at a graduated circle of 500 graduation units E.

TABLE

| Marking Number $n$ | Distance Value Forwards $+D_a$ | Backwards $-D_a=500-D_a$ | Absolute Value $N_a$ |
|---|---|---|---|
| 14 | — | — | 467 |
|    | +33 | −33= 467 | |
| 15=0 | — | — | 000 |
|    | +26 | −26= 474 | |
| 1 | — | — | 026 |
|    | +41 | −41= 459 | |
| 2 | — | — | 067 |
|    | +27 | −27= 473 | |
| 3 | — | — | 094 |
|    | +40 | −40= 460 | |
| 4 | — | — | 134 |
|    | +28 | −28= 472 | |
| 5 | — | — | 162 |
|    | +39 | −39= 461 | |
| 6 | — | — | 201 |
|    | +29 | −29= 471 | |
| 7 | — | — | 230 |
|    | +38 | −38= 462 | |
| 8 | — | — | 268 |
|    | +30 | −30= 470 | |
| 9 | — | — | 298 |
|    | +37 | −37= 463 | |
| 10 | — | — | 335 |
|    | +31 | −31= 469 | |
| 11 | — | — | 366 |
|    | +35 | −35= 465 | |
| 12 | — | — | 401 |
|    | +32 | −32= 468 | |
| 13 | — | — | 433 |
|    | +34 | −34= 466 | |
| 14 | — | — | 467 |
|    | +33 | −33= 467 | |
| 0=15 | — | — | 500=000 |
|    | +26 | −26= 474 | |
| 1 | — | — | 026 |
|    | +41 | −41= 459 | |
| 2 | — | — | 067 |

As shown in the Table by way of example, mark No. 0 (zero) corresponds to the reference position of the movable component, for an absolute value 000 (zero) is assigned thereto. It may be noted that, as the 15 marks are distributed at a circle, they are numbered "mudolo 15", that is to say, mark No. 0 is coincident with mark No. 15 which is reached after a complete revolution of the circular scale tracks. Mark No. 1 is spaced from mark No. 0 by 26 graduation units E, mark No. 2 is spaced from mark No. 1 by 41 graduation units E, and so forth according to the listings in columns one and two of the Table reading the same from left to right. As will readily appear from checking these listings, all spacings between neighboring marks are different from each other.

Supposing now that the component whose position is to be measured absolutely is first located at the reference position thereof, which is also the position where mark No. 0 triggers a mark-signal $I_{ao}$ in pulse generator 18. Let the component then be displaced to a new position where mark No. 1 triggers a mark-signal: the displacement of the component then amounts to the distance between marks No. 0 and No. 1, which distance is measured in graduation units E with a value of 26 such units E in the embodiment under discussion by way of example. Accordingly, the absolute value of the new position of the component is also 26 (measured in graduation units E), which value is listed as 026 in the last column of the Table on the same line as the marking-number 1 of mark No. 1. Similarly, supposing the component is displaced from a first position where mark No. 1 triggers a mark-signal to a new position where mark No. 2 triggers a mark-signal, then the displacement amounts to 41 as listed in column two of the Table; the starting position of the component being in this case assigned the absolute value 026 associated with mark No. 1, the new position reached will correspond to an absolute value of $(026 + 41) = 067$ as listed in column four of the Table on the same line as the now-reached marking-number 2. The listing of marking-numbers and absolute values corresponding to each other will proceed in the same manner until mark No. 15 is reached, at which point the component again will have reached its reference position, having accomplished one whole revolution, i.e., the position then reached is assigned either the absolute value 000 or 500, and therefore all absolute values are defined "modulo 500".

Supposing that the component is displaced from a first position where a first unknown mark triggers a mark-signal to a second position where a second unknown mark triggers the next following mark-signal, and there has been measured (by means to be described below) a distance of + 41 graduation units E between the first and the second position, then the only possible case according to the Table is that the component has been moved from the position corresponding to mark No. 1 triggering a mark-signal to the position corresponding to mark No. 2 triggering a signal; this result from the distance value + 41 in column two of the Table being a characteristic number assigned unambiguously to the displacement from mark No. 1 to mark No. 2 identified by their marking-numbers in column one of the Table. Accordingly, the position of the component reached at the end of the displacement has assigned thereto the absolute value 067 as indicated in the fourth column of the Table on the same line as marking-number 2. Similarly, supposing that between unknown marks there has been measured a distance of + 32 graduation units E, then the mark which triggers a mark-signal at the end of the displacement only can be mark No. 13, and therefore the component will have reached the position defined by the absolute value 433 measured in graduation units E, as may be read off the Table on the same line as marking-number 13; there is no other possibility, i.e. the absolute value of the position reached is defined unambiguously.

In the reverse direction of displacement of the component, there will be measured negative values of the distance between neighboring marks. A displacement of − 37 graduation units E, for example, may occur only from mark No. 10 triggering a mark-signal to mark No. 9 triggering a mark-signal, and therefore the component will have reached unambiguously the position associated with the absolute value 298 measured in graduation units E. It is, however, inconvenient to use a Table or allocation means having inputs numbers which occur in pairs of opposite signs; when electrically automating the allocation function, provision must be made in the present example for a two-digit address complemented by a special digit carrying the sign. It is more convenient to use three identical digits to identify the address. Using the fact that all absolute values are defined "modulo 500" and that all distances $\pm D_a$ are actually equal to respective differences between neighboring absolute values, there can be systematically added 500 to all values $\pm D_a$ as shown in column three of the Table (this has not been shown in column two of the Table, for the sake of simplicity). Accordingly, the list of all distances $D_a$ possibly measured between any two neighboring marks in either direction of displacement (a list of 30 values in the present example) will be changed in one-to-one correspondence to a list of numbers ranging from 26 to 41 and from 474 to 459. It may be still more convenient to unite the above two range portions by using the "modulo 15" rule to add 500 to all numbers of the lower range, thus obtaining a list of values ranging from 474 to 541 each being assigned a corresponding absolute value. Thus, the Table or allocation means has one list of entries or addresses and one list of corresponding readings or outputs; this has not been tabulated, as it is considered evident to those skilled in the art.

As will be explained below, it is perferably to exclude the numbers 000 or the equivalent number 500 from the list of entries or addresses in order to prevent a reversal of motion of the component to impair the determination of the absolute value of the component position.

Figure 2:
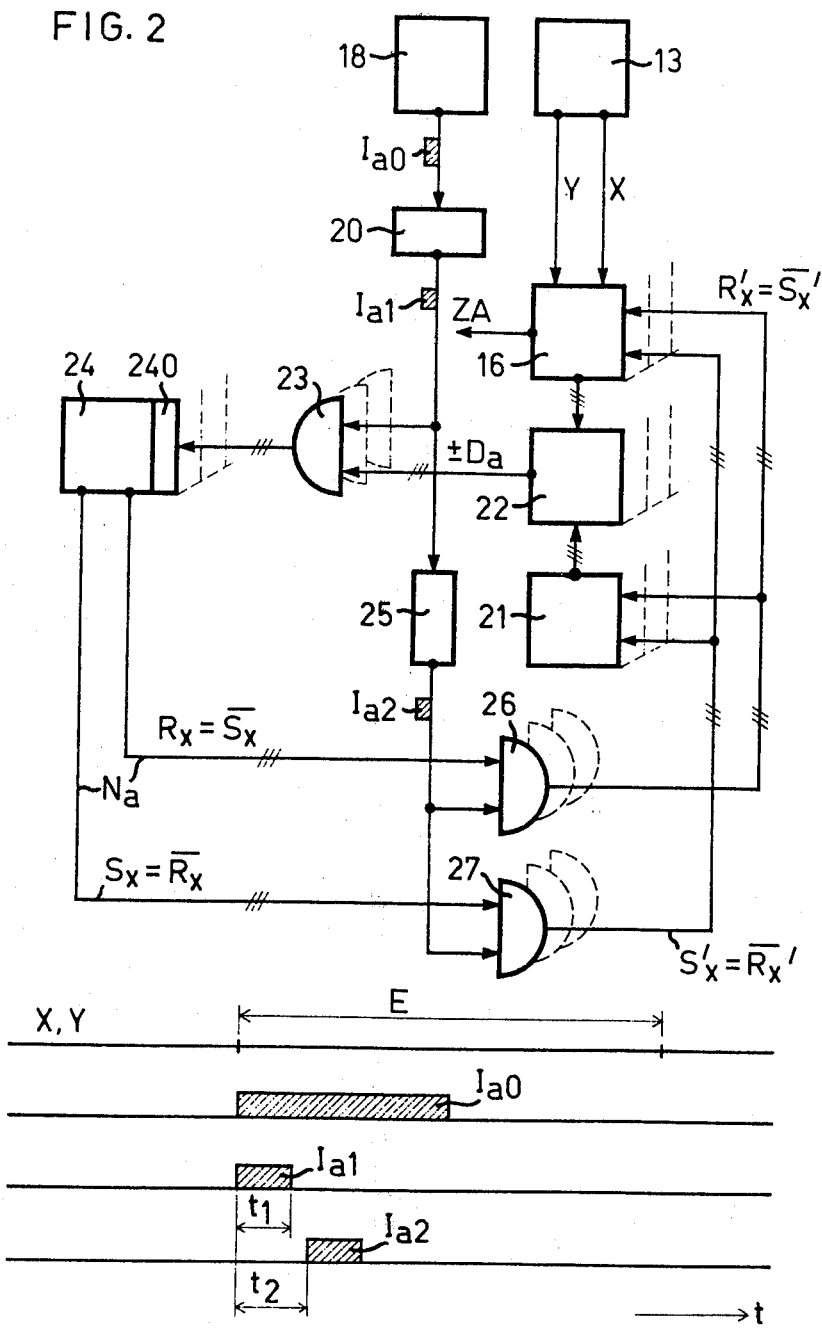
FIG. 2 is a circuit diagram showing equipment for evaluating the signals.

According to the showing of both FIG. 1 and 2, the binary signal sequence X, Y is delivered from the transformation circuit 13 to the increment counter 16, so that the traversing of the reading location of graduation units E of the movable increment scale 11 in front of the reading location of the corresponding stationary reading means is properly counted with respect to the direction of traversing. The counter state of such increment counter 16 basically displays at any moment of time the momentary distance of the momentary reading location of the movable scale carrier 10 from a reference location.

In FIG. 2 reference numeral 21 designates a counter-state storage means which, as will be explained more fully hereinafter, is set to store the increment-counter state of the increment counter 16 every time there occurs a mark-signal $I_{ao}$ and which stores such increment-counter state until there occurs the next following mark-signal. Such storage means is well known in the art and need not be described in detail.

Between the counter-state storage means 21 and the increment counter 16 there is operatively connected a counter-state comparator 22 constructed to generate at any moment of time at its output the difference between the momentary counter state of the increment counter and the previous increment-counter state as stored at the storage means. Such a device delivering at any moment at its output the difference of two numbers delivered as counter states or storage states at its two inputs is simply a conventional arithmetic subtracting device and is well known in the art and thus need not be described in detail.

A monostable or one-shot multivibrator 20 serves the purpose of transforming the absolute-value mark-signals $I_{ao}$ delivered from the pulse generator 18 and which have their duration dependent upon the displacement speed of the movable scale carrier 10 into pulses $I_{a1}$ of fixed duration $t_1$. These pulses $I_{a1}$ are transmitted to a time-delay element 25 where they are delayed by the time $t_2 > t_1$ and wherefrom they are further transmitted in the form of the time-delayed pulses $I_{a2}$ having the same fixed duration $t_1$.

Reference numeral 24 designates an allocation means or device which is appropriately programmed according to the previously discussed Table to deliver at its output the absolute value $N_a$ associated with a distance value $D_a$ transmitted to its input. Such allocation means can be, for instance, a conventional ROM (read-only-memory) with a forwardly connected input means 240. This input means 240 serves all functions which are necessary to transform the output of the comparator 22 into a proper addressing signal for the allocation means: for instance and if required, the bit-parallel to bit-serial or reverse transformation of the comparator output, and the function of adding 500 to this output if such function is not incorporated directly into the counter-state comparator 22. Performing such functions on digital signals is considered well known in the art and thus need not be explained in detail.

Reference numerals 23, 26, 27 designate logical AND-gates. The gate 23 is rendered conductive by each pulse $I_{a1}$ and the gates 26 and 27 are rendered conductive by each time-delayed pulse $I_{a2}$. Consequently, each pulse $I_{a1}$ triggers the transmission to the input means 240 of the allocation means 24 of the momentary differential value or difference value delivered by the comparator 22, and the time-delayed pulses $I_{a2}$ bring about the transmission of a corresponding combination of reset and set signals $R_x$ and $S_x$ respectively, both to the increment counter 16 as well as to the counter-state storage means 21. As indicated in FIG. 2 by the designation $N_a$ and by slash lines or signs on the respective connection lines, the signals $R_x$ and $S_x$ convey the same number of digits as are conveyed from the counter 16 and the storage means 21 to the comparator 22 and from such comparator to the allocation means 24. Those skilled in the art will appreciate that it is known to perform at a counter the function of setting the counter to a predetermined state as defined by digits delivered to an input of this counter.

In the drawings there has been indicated with phantom lines which of the previously discussed elements of the circuit of FIG. 2 are present a number of times in accordance with the bit-number of the measuring system. Additionally, it is to be remarked that in the Table according to which the allocation means 24 is programmed the number 000 or 500 is not contained in the list of possible distance values; therefore the difference value $D_a = 000$ or 500 which may be delivered by the comparator 22 does not address properly the allocation means 24 and thus does not generate any $R_x$ and $S_x$ signals nor does it influence the increment counter 16 or the storage means 21.

After each interruption in operation, the first occurrence of a mark-signal $I_{ao}$ entails at a first cycle phase defined by pulse $I_{a1}$ the transmission to the allocation means 24 of the state of the comparator 22, which state may or may not be a proper address of the allocation means 24 depending upon the contingent states of counter 16 and storage means 21. During a second cycle phase defined by pulse $I_{a2}$ both the counter 16 and the storage means 21 are set to one and the same state as delivered by the allocation means, this state being either 000 if the allocation means is not properly addressed or any contingent number $N_a$ if by chance the allocation means has been properly addressed. The next-following occurrence of a mark-signal $I_{ao}$ will again entail the transmission of the state of the comparator 22 to the allocation means 24, which state now is the actual number of graduation units E counted between the occurrence of the first and the second mark-signal $I_{ao}$. This number is actually a proper address of the allocation means 24, which delivers a corresponding absolute value $N_a$, both the counter 16 and the storage means 21 then being set to this value or state. Therefore, latest after the occurrence of the second mark-signal generated by the second traversing of an absolute-value mark in front of the mark-reading means, the counter state which can be tapped-off at the counter output ZA of the increment counter 16 has the correct value corresponding to the position attained at said second traversing. From then on, if the system is working in a faultless manner, the absolute value $N_a$ delivered to the counter 16 at each occurrence of a mark-signal will be exactly the same value which is anyway displayed at the counter 16. But if a fault occurs in the counting of increments, then the first occurrence of a mark-signal will generate a situation similar to the above-described situation when the system has just been put into operation, and the next-following mark-signal will again generate a now-corrected counter state of the increment counter 16. In this manner the system is self-correcting.

Of course, the circuitry of FIG. 2 must operate so rapidly that always between the beginning of a pulse $I_{a1}$ and the end of the corresponding delayed pulse $I_{a2}$ all functions will have transpired before there is counted at the increment counter 16 a new graduation unit E, if there are not provided any signal-blocking means according to my aforementioned Swiss patent 499,091, the disclosure of which is incorporated herein by reference.

Figure 3:
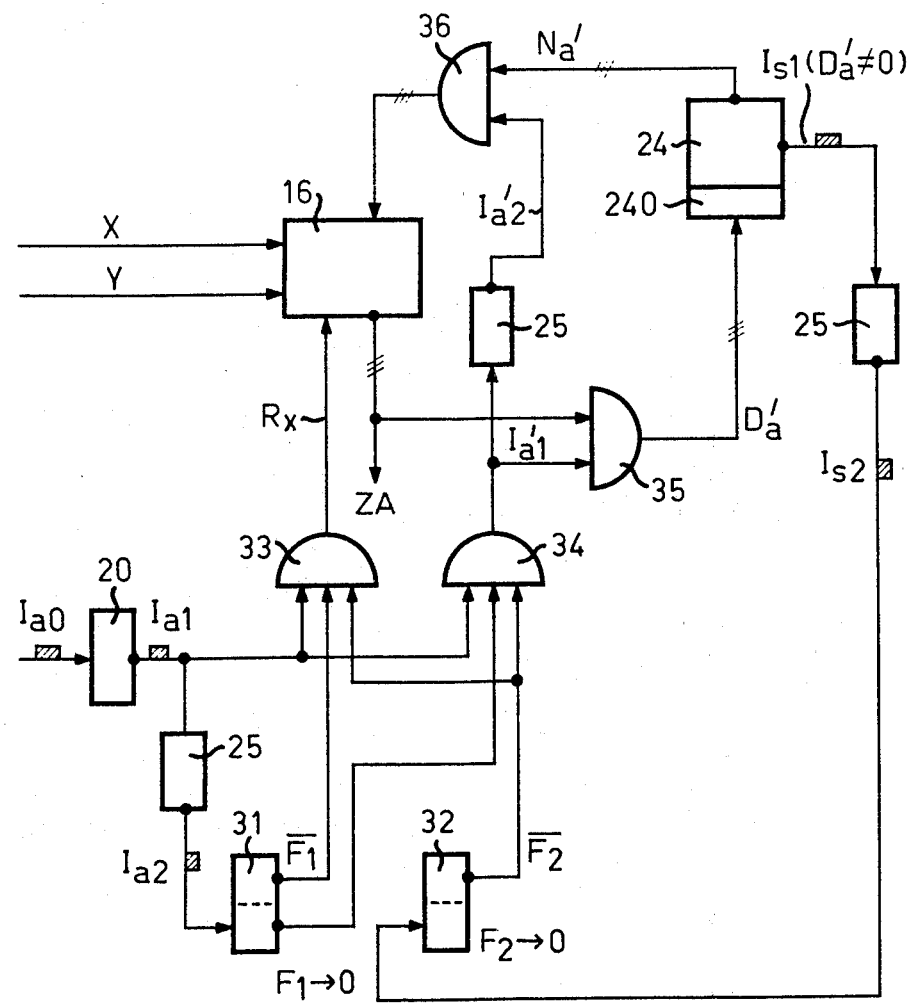
FIG. 3 is a modification of the arrangement depicted in FIG. 2.

The variant construction of circuitry depicted in FIG. 3 does not contain any counter-state storage means 21 and counter-state comparator 22. On the other hand, this circuit operates in a manner such that after each interruption in operation the first occurring mark-signal $I_{ao}$ resets the increment counter 16 to the state 000, so that at the moment the next-following mark-signal $I_{ao}$ occurs, the then attained state of the increment counter 16 corresponds to the sought-for difference value $D_a'$, and the increment counter 16 is then set to the associated correct absolute value $N_a'$.

The components which have also been shown in the circuit configuration of FIG. 2 have been designated with the same reference numerals in the circuitry of FIG. 3. Reference numerals 31 and 32 designate two flip-flops each with respective preferred states $F_1 = 0$ and $F_2 = 0$ which they assume when placed into operation after an interruption in operation. Reference numerals 33, 34, 35 and 36 designate logical AND-gates. Immediately after placing into operation the measuring system, the increment counter 16 begins to count, sign-correct, the periods E of the two-phase binary signal X, Y: however, the counter state attained at the occurrence of the first mark-signal $I_{ao}$ is not correct. Since at such occurrence both of the outputs $\bar{F}_1$ and $\bar{F}_2$ of the flip-flop circuits 31, 32 possess the logical state 1, the gate 33 already transmits the first pulse $I_{a1}$ as a reset signal $R_x$ to the increment counter 16 which is thereby set to the counter state 000. The first delayed pulse $I_{a2}$ sets the flip-flop 31 from the preferred state $F_1 = 0$ into the state $F_1 = 1$, which is retained until the next interruption in operation eventually occurs. Consequently, the AND-gate 33 is blocked ($\bar{F}_1 = 0$). On the other hand the gate 34 is rendered conductive for the next-following or second pulse $I_{a1}$. This second pulse $I_{a1}$ which passes through the gate 34 and is labeled $I_{a1}'$ at the output of gate 34 renders the gate 35 conductive and permits the momentarily attained state ZA of the increment counter 16 to be transferred as a difference value $D_a'$ to the input means 240 of the allocation means 24. The associated correct absolute value $N_a'$ from the output of the allocation means 24 however can first arrive at the increment counter 16 for the correction thereof under the action of the second delayed pulse $I_{a2}'$.

In the event that, when the system is placed into operation after an interruption in the operation, the direction of movement of the scale carrier 10 is reversed directly after the traversing of a first leading location $BZ_n$ of a mark and prior to the traversing of a neighboring reading location $BZ_{n \pm 1}$ of a neighboring mark in front of the reading location BZ of the mark-readings means, the increment counter 16 will display the counter state $ZA = 000$ at the repeated traversing of the first reading location of a mark in the opposite direction. In this exceptional case the input means 240 of the allocation means 24 has delivered thereto as address $D_a'$ the value 000 which does not produce any further effect in the allocation means 24. As soon as however (after the traversing of a reading location $BZ_{n \pm 1}$ in front of the reading location BZ) a counter state $ZA \neq 0$ is transmitted to the input means 240 of the allocation means 24, then such generates a blocking pulse $I_{s1}$ at a corresponding output of the allocation means 24. This blocking pulse $I_{s1}$ is delayed at the time-delay element 25 by an amount corresponding to time $t_2$ and appears at the output thereof in the form of the time-delayed pulse $I_{s2}$, which switches the flip-flop 32 into the state $F_2 = 1$, $\bar{F}_2 = 0$, so that all further pulses $I_{a1}$ are blocked by the gate 34. Techniques by means of which it is possible to derive a pulse $I_{s1}$ from a non-zero output of gate 35 which drives the allocation means 24 are well known in the art, and therefore, need not be here considered in further detail.

In this way there is insured that with the circuit arrangement according to the showing of FIG. 3 the counter state of the increment counter 16 indicates the correct absolute value after two neighboring absolute-value marks have traversed in front of the mark-reading means. On the other hand, in contrast to the circuit arrangement of FIG. 2, the simplified measurement system according to FIG. 3 does not bring about any control or correction of the counter state ZA of the increment counter 16 during each traversing of an absolute-value mark in front of the mark-reading means.

The previously discussed invention which has been explained, by way of example, on the basis of the drawings combines a known incremental measuring system with a novel absolute-value measuring system, which with only one additional scale track 12 and with only one additional mark-reading means comprising the photoelectric cell arrangement 120 delivers at a multiplicity of discrete mark locations the correct absolute values $N_a$ for the control or resetting, respectively, of the increment counter 16. Apart from the absolute-value marks MA which are coded according to the drawing and the associated photoelectric cell arrangement 120, it is possible to devise a multiplicity of variant embodiments of the invention, for instance extending over longer sections of the increment scale 11, which always deliver a characteristic mark-signal $I_{ao}$ upon coincidence of the corresponding reading locations BZ and $BZ_n$ and only in such case.

Similarly, for each number $N_t$ of graduation units of the increment scale there can be determined many different variations of allocation tables each with a maximum number $\sqrt{2 N_t}$ of absolute-value marks MA, for instance 200 to 300 marks with a circle division having 50,000 graduation units E. However, the wider the marks MA are constructed in consideration of better utilization of the light, that much smaller becomes the maximum number of absolute-value marks.

While there is shown and described present preferred embodiments of the invention, it is to be distinctly understood that the invention is not limited thereto, but may be otherwise variously embodied and practiced within the scope of the following claims.

What is claimed is:

1. An apparatus for measuring the longitudinal or angular displacement of a component, comprising a scale carrier adapted to be supported by the component and movable in a predetermined measurement direction, said scale carrier having a first track comprising an increment scale subdivided into equal graduation units, first stationary reading means defining a first reading location for reading the graduation units moving past the reading location, evaluation means in circuit with said first reading means and comprising an increment counter for the continuous storage of the algebraic sum of the graduation units of the increment scale moving past said first reading location and read by said first reading means, the movable scale carrier possessing a second track arranged substantially parallel to the increment scale, said second track containing a multiplicity of absolute value markings, each marking possessing a predetermined spacing from the next following marking, second stationary reading means defining a second reading location for reading the absolute value markings moving past the second reading location, said evaluation means including means for counting each said spacing in graduation units of the increment scale, the spacing of each marking from the next following marking characterizing an absolute value of its spacing from a null position, said evaluation means including a fixedly programmed allocation device, said evaluation means including means for determining the number of graduation units of the increment scale which have been counted sign-correct at the increment counter from the time of throughpassage of any given one of the absolute value markings up to the throughpassage of the next following absolute value marking, said evaluation means further ascertaining for said characteristic spacing value the associated correct absolute value from said fixedly programmed allocation device and correcting any possibly previously incorrect counter state of the increment counter to the correct absolute value.

2. The measuring apparatus as defined in claim 1, wherein said increment scale constitutes a photoelectrically readable increment scale containing at each graduation unit a dark line and a light line of the same width, said absolute value markings being constituted by code combinations of light and dark strips which extend in length over a multiplicity of graduation units of the increment scale, said absolute value markings in conjunction with said second reading means and said evaluation means generating a characteristic marking pulse during passage of a reference center of an absolute value marking through said second reading location and which reference center is aligned with a predetermined graduation unit of the increment scale.

3. The measuring apparatus as defined in claim 1, wherein said means for counting each said spacing of said absolute value markings comprises a counter state storage which can be set to a new counter state by a pulse, a counter state-comparator means operatively connected in circuit between the increment counter and said counter state storage, said counter state-comparator means during a first clock phase, directly after passage of an absolute value marking through said second reading location, transmitting the characterizing spacing value as a sign-correct difference between an earlier state of the increment counter and a new state of the increment counter to an input of said allocation device, and during a second clock phase, prior to counting a further graduation unit, the absolute value associated with the characterizing difference value is simultaneously transmitted to the counter state storage and the increment counter as a new correct counter state.

4. The measuring apparatus as defined in claim 1, wherein said evaluation means includes means enabling the first absolute value marking passing through said second reading location, after placing the measurement apparatus into operation, to set the increment counter to the counter state null, and during a first clock phase the counter state attained upon throughpassage of the next following absolute value marking is transmitted as the characterizing spacing value to an input of the allocation device and during a second clock phase the thus resulting correct absolute value is transmitted back to the increment counter.

5. In a system for measuring the longitudinal or angular displacement of a component movable with respect to a reference position thereof in one of two possible opposite directions, comprising an increment scale track supported substantially lengthwise parallel to said directions at a scale carrier affixed to the component and having an increment scale subdivided into graduation units of equal magnitude, a stationary increment-reading means, in increment-counting means and electrical circuit means for counting properly with respect to the direction of displacement the algebraic sum of the graduation units traversing in front of the increment-reading means, a second scale track supported substantially lengthwise parallel to the increment scale track at the scale carrier and having a multiplicity of absolute-value marks each having a reading location, a stationary mark-reading means having a reading location and electrical circuit means for generating a mark-signal at the traversing of the reading location of a mark in front of the reading location of the mark-reading means, and a reference location at the second scale track is coincident with a location thereof which would traverse in front of the reading location of the mark-reading means if the component would be located at its reference position, the improvement comprising: said second scale track having the distance between any two next-neighboring marks constituting a characteristic number of graduation units with which there is unambiguously associated a value of the distance between the reading location of a selected one of said two marks and the reference location at the second track.

6. The system as defined in claim 5, wherein the selected one of said two marks is the one mark whose reading location traverses latest in front of the reading location of the mark-reading means in the course of the displacement of the component.

7. The system as defined in claim 5, wherein said characteristic number and said value of the distance are associated with each other according to a predetermined correspondence fixed in an allocation means.

* * * * *